United States Patent [19]

Spence

[11] Patent Number: 5,766,806
[45] Date of Patent: Jun. 16, 1998

[54] METHOD OF OPTICAL LITHOGRAPHY USING PHASE SHIFT MASKING

[75] Inventor: Christopher A. Spence, Sunnyvale, Calif.

[73] Assignee: Advanced Micro Devices, Inc., Sunnyvale, Calif.

[21] Appl. No.: 711,112

[22] Filed: Sep. 9, 1996

Related U.S. Application Data

[63] Continuation-in-part of Ser. No. 276,734, Jul. 18, 1994, Pat. No. 5,573,890.
[51] Int. Cl.⁶ ........................................... G03F 9/00
[52] U.S. Cl. ........................................ 430/5; 430/311
[58] Field of Search .................... 430/5, 311, 312, 430/313

[56] References Cited

U.S. PATENT DOCUMENTS

| | | | |
|---|---|---|---|
| 5,302,477 | 4/1994 | Dao | 430/314 |
| 5,308,722 | 5/1994 | Nistler | 430/5 |
| 5,308,741 | 5/1994 | Kemp | 430/396 |
| 5,328,807 | 7/1994 | Tanaka | 430/396 |
| 5,352,550 | 10/1994 | Okamoto | 430/396 |
| 5,567,553 | 10/1996 | Hsu et al. | 430/5 |
| 5,573,890 | 11/1996 | Spence | 430/311 |

OTHER PUBLICATIONS

T. Waas et al., Automatic Generation of Phase Shift Mask Layouts, *Microelectronic Engineering* 23 (Mar. 1994) pp. 139–142, Elsevier Science B.V.

K. Ooi et al., Computer Aided Design Software for Designing Phase–Shifting Masks, *Jpn. J. Appl. Phys.*, vol. 32 (Jul. 1993), Pt. 1, No. 12B, Dec. 1993, pp. 5887–5891.

A. Moniwa et al., Algorithm For Phase–Shifting Mask Design with Priority on Shifter Placement, *Jpn. J. Appl. Phys.*, vol. 32 (Jul. 1993), Pt. 1, No. 12B, pp. 5871–5879.

H. Jinbo et al., 0.2 µm Or Less i–Line Lithography by Phase–Shifting–Mask Technology, *1990 International Electron Devices Meeting Technical Digest*, Dec. 9–12, 1990, pp. 004–007.

*Primary Examiner*—S. Rosasco
*Attorney, Agent, or Firm*—Foley & Lardner

[57] ABSTRACT

A method of performing poly level lithography in manufacturing an integrated circuit using a phase shift mask in a step and repeat optical tool where the phase assignment for said phase shift mask is determined by a technique which determines, without assignment conflict, the Intersection of the gate pattern with the active gate pattern and which divides the Intersection into categories of stacks where a slightly different phase assignment rules is employed for the different stacks.

27 Claims, 16 Drawing Sheets

LIGHT AMPLITUDE IMMEDIATELY AFTER TRANSMISSION THROUGH MASK

LIGHT AMPLITUDE ON WAFER

LIGHT INTENSITY ON WAFER

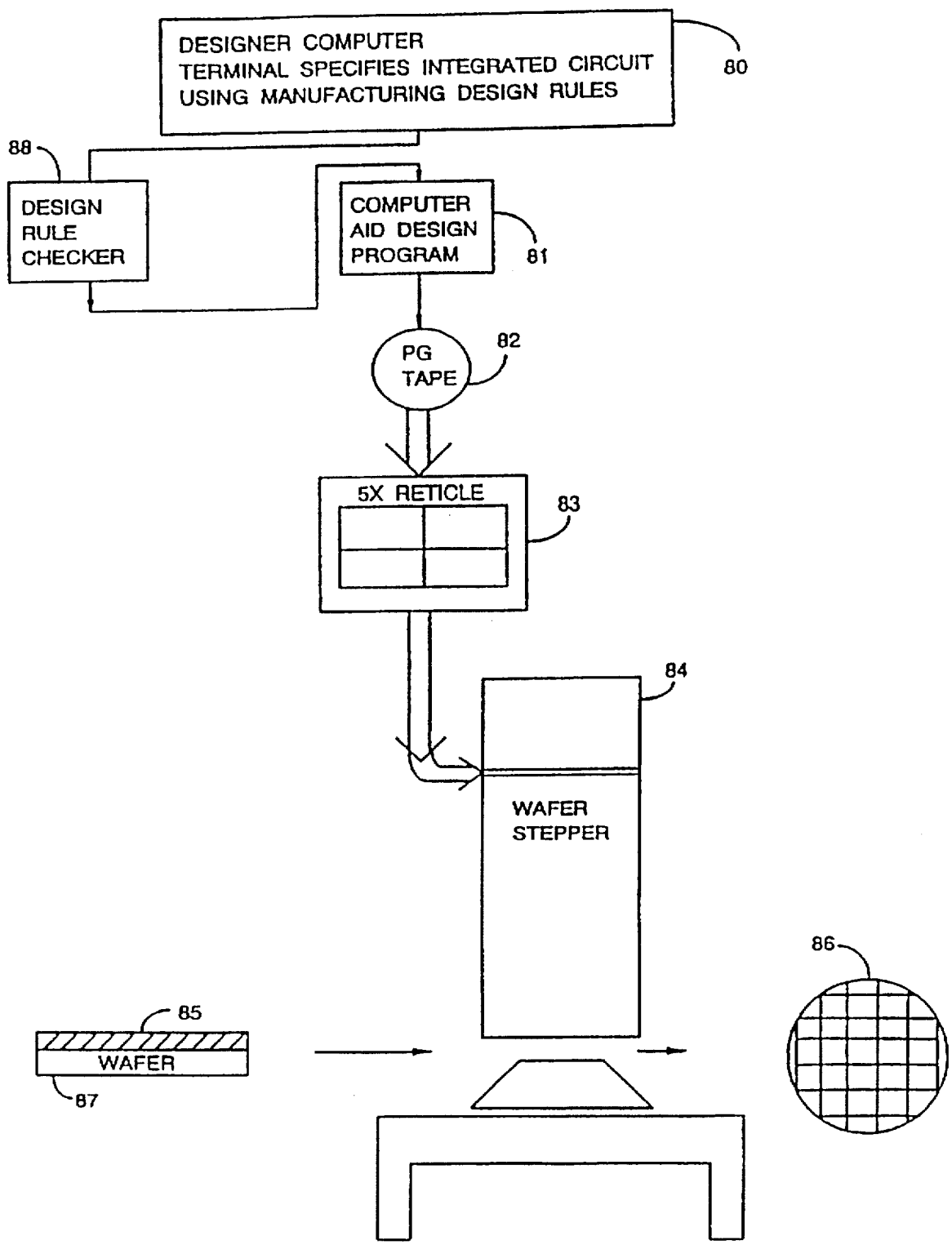

STANDARD DESIGN

GATE SHRINK

METHOD OF OPTICAL LITHOGRAPHY USING PHASE SHIFT MASKING

This application is a continuation-in-part application of Application Ser. No. 08/276,734, filed Jul. 18, 1994, now U.S. Pat. No. 5,573,890.

BACKGROUND OF THE INVENTION

1. Field of the Invention

The invention relates to a field of integrated circuit manufacture using phase shift masking in the optical lithographic patterning process.

2. Description of the Related Art

Optical lithography has been the technique of choice employed for forming circuit patterns in integrated circuits. Typically, ultraviolet light is directed through a mask. A mask is similar in function to a "negative" which is used in ordinary photography. However, a typical mask has only fully light transmissive and fully non-transmissive regions as opposed to an ordinary negative which has various "gray" levels. In the same manner, as one makes a print from a negative in ordinary photography, the pattern on the mask can be transferred to a semiconductor wafer which has been coated with a photoresist layer. An optical lens system provides focusing of the mask patterns onto the surface of the photoresist layer. The exposed photoresist layer is developed, i.e. exposed/non-exposed regions are chemically removed. The resulting photoresist pattern is then used as a mask for etching underlying regions on the wafer.

In recent years, demands to increase the number of transistors on a wafer have required decreasing the size of the features but this has introduced diffraction effects which have made it difficult to further decrease the feature size. Prior to the work of Levenson, et. al., as reported in "Improving Resolution in Photolithography with a Phase Shifting Mask," IEEE Transactions on Electron Devices, VOL., ED-29, Nov. 12, December 1982, pp. 1828–1836, it was generally thought that optical lithography would not support the increased density patterning requirements for feature sizes under 0.5 microns. At this feature size, the best resolution has demanded a maximum obtainable numerical aperture (NA) of the lens systems. However, the depth of field of the lens system is inversely proportional to the NA, and since the surface of the integrated circuit could not be optically flat, good focus could not be obtained when good resolution was obtained and it appeared that the utility of optical lithography had reached its limit. However, the Levenson paper introduced a new phase shifting concept to the art of mask making which has made use of the concepts of destructive interference to overcome the diffraction effects.

Ordinary photolithography, with diffraction effects, is illustrated in FIGS. 1(a) to 1(d). As the apertures P1 and P2 become closer, N becomes smaller, and as seen in FIG. 1(b), the light amplitude rays which pass through P1 and P2 start to overlap due to diffraction effects. These overlapping portions result in light intensity at the wafer, FIG. 1(d), which impinges on the photoresist layer. Accordingly, due to diffraction, the intensity of the wafer no longer has a sharp contrast resolution in the region between P1 and P2. The width of N at which optical diffraction effects significantly degrades the sharp contrast resolution in the region between P1 and P2 is defined as "minimum" width.

As illustrated by FIGS. 2(a) to 2(e), it is possible to make use of the fact that light passing through the masking substrate material 51 (FIG. 2(a)) or 51' (FIG. 2(b)) exhibits a wave characteristic such that the phase of the amplitude of the light exiting from the mask material is a function of the distance the light ray travels in the substrate material, i.e., thickness $t_1$ and $t_2$. By making the thickness $t_2$ such that $(n-1)(t_2)$ is exactly equal to $\frac{1}{2}\lambda$, where $\lambda$ is the wavelength of the light in the mask material, and n= refractive index of the added or subtracted natural material, then the amplitude of the light existing from aperture P2 is in opposite phase from the light exiting aperture P1. This is illustrated in FIG. 2(c) showing the effects of diffraction and use of interference cancellation. The photoresist material is responsive to the intensity of the light at the wafer. Since the opposite phases of light cancel where they overlap and since intensity is proportional to the square of the resultant amplitude, as seen in FIG. 2(d), contrast resolution is returned to the pattern.

FIGS. 2(a) and 2(b) illustrate two different techniques for obtaining the interference phase shifting. In FIG. 2(a), the light traverses through a longer distance via deposited layer 52. In FIG. 2(b), the light in region P2 transverses through a shorter distance by virtue of an etched groove 52' in the wafer 51'.

Phase shifting masks are now well known and there are many varieties which have been employed, as more fully set out in the article by B. J. Lin, "Phase-Shifting Masks Gain an Edge," Circuits and Devices, March 1993, pp. 28–35. The configuration of FIGS. 2(a) and 2(b) have been called alternating phase shift masking (APSM). Several researchers have compared the various phase shifting techniques and have shown that the APSM approach is the only known method proven capable of achieving resolution 0.25 microns and below, with depth of field as large as ±0.34 microns with an I line stepper. Alternating PSM can be implemented in dark and light field mask versions. If the dark field strategy is employed for alternating PSM, a negative tone photoresist must be employed and if light field version is employed, a positive photoresist must be chosen. The positive resist portion which is exposed to UV is removed during development and vice versa for negative resist.

As illustrated in FIG. 2(e), the process for making and using binary masks have been highly computerized. The designer of complex integrated circuits now works at a computer terminal and specifies a circuit design on a computer which requires compliance with certain predetermined design rules 80. The initial design is validated using a design rule checker software 88. Accordingly, when the functional design is completed, a computer aided design tool program 81 automatically creates a digital bit map or vector file called a PG Tape 82 which represents the data in a standard and known data format for manufacturing the mask to accomplish the design. These digital files are then used to control automatic processes for manufacturing the masks, typically resulting in a magnified, eg. 5×, physical reticle 83, containing the mask pattern for each layer of the integrated circuit. The mask is then typically installed in a wafer stepper (a step and repeat optical tool) 84, which automatically carries out the lithographic exposure repeatedly on the wafer 87 by exposing the photoresist layer 85 at a physical location and moving the wafer, i.e. stepping, and repeating the same exposure at an adjoining location.

To date, due to various difficulties, alternating phase shifting masks have not generally been able to be designed automatically by the mask creation programs. This has required mask designers to expend time consuming and tedious manual analysis and has greatly increased the expense of producing PSM.

The problem with alternating PSM is that the dark field/negative resist strategy does not perform well for non-dense line patterns and the light field/positive resist strategy creates unwanted opaque lines corresponding to the 0°/180° transitions in the mask.

Accordingly, in order to employ alternating PSM for isolated patterns, it is necessary to solve the problems with the light field/positive resist strategy and to develop a method for automatically creating compensation or trim masks for eliminating the effect of unwanted opaque lines which form along 0°/180° transitions.

SUMMARY OF THE INVENTION

It is an object of this invention to provide a method for improving the patterning of integrated circuits using light field photolithography with positive photoresists.

It is another object to provide a method for improving the patterning of integrated circuits using dark field photolithography with negative photoresists.

It is still another object of the invention to simplify the design of the phase shift masking for the gate level patterning of an integrated circuit which compensates for 0°/180° transition effects.

It is yet still another object to provide a method to define a phase shift mask for the gate level patterning which provides phase shift elements to improve the dimensional control of the gate level pattern only in the integrated circuit region where the gate pattern overlays the active area pattern of the integrated circuit.

It is a still further object to provide a PSM method which enables maximally reduced gate patterns in the integrated circuit region where the gate pattern overlays the active area pattern of the integrated circuit.

It is a still further object to manufacture integrated circuits having better critical dimension control of the gate level pattern using the improved PSM methods of this invention.

It is a still further object to provide a process which automatically analyzes an IC logic circuit design and provides a digital file according to an accepted standard for manufacturing an alternating PSM for logic circuits.

BRIEF DESCRIPTION OF THE DRAWINGS

FIG. 2(e) is illustrative of the mask production and IC photolithographic production process.

DETAILED DESCRIPTION OF THE PREFERRED EMBODIMENTS

It is generally believed by those skilled in PSM lithography that a mask employing a light field cannot be automatically designed by a computer for integrated circuit application in the design of alternating PSM layouts. Light field designs use opaque regions on the PSM mask to correspond to the location and shape of the conductive lines, typically doped low resistivity polysilicon, or tungsten silicide or the equivalent, to be formed on the resulting wafer and positive photoresist must be employed in combination with the light field mask. This light field design with PSM has a very significant advantage for logic gate layout in that it provides improved resolution in connection with isolated gates. However, it also has the disadvantage that dark lines form along every abutting 0°/180° region. To date, light field alternating PSM have needed to be designed by examining manually each PSM design and by either inserting a compensating phase shift transition region separating each 0° region from each 180° region or by manually designing a trim mask to be used in conjunction with a PSM which has no phase shift compensating regions.

To simplify and provide an automatic solution to the alternating PSM problem, I propose an approach for designing a light field alternating PSM which appears to work reliably for logic circuits and for reliably shrinking gate size for logic circuits. The underlying premise of my approach is to apply the alternating phase shifts only to those regions of the gate level PSM mask where the gate lines provided by a standard gate level pattern design would overlay the regions in which active semiconductor (N and P) are to be formed. In Boolean algebra, where X is a first function and Y is a second function, the common overlay region is called the intersection and is designated Z =X∩Y. (This is also called the "AND" function.) Hereinafter, the overlay region is designated the "Intersection." The "Intersection" typically has two sides and two ends. The sides run along the length of the "Intersection" and the ends run along the width of the "Intersection."

Figure 1A:
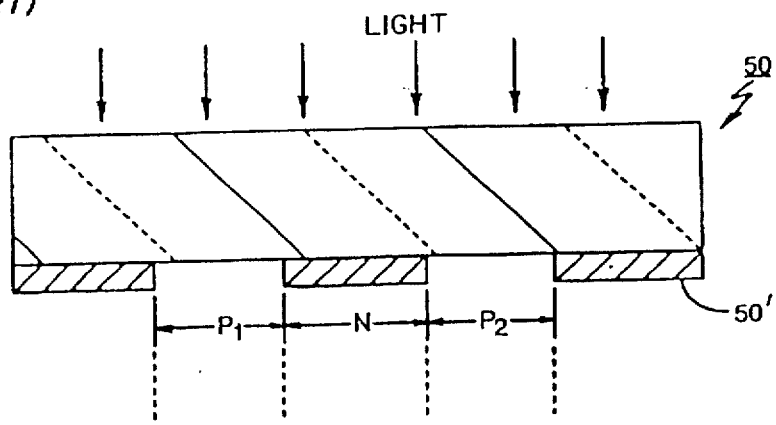
FIGS. 1(a) to 1(d) are schematic representations of diffraction effects using a prior art ordinary binary transmission mask in photolithography.
Figure 1B:
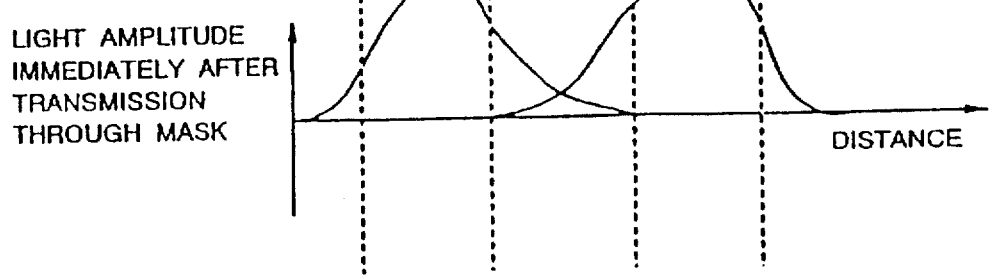
Figure 1C:
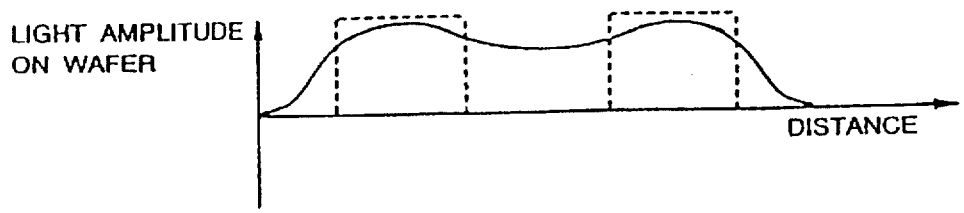
Figure 1D:
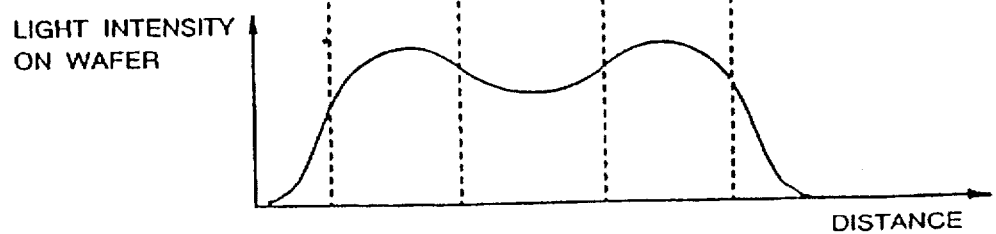
Figure 2A:
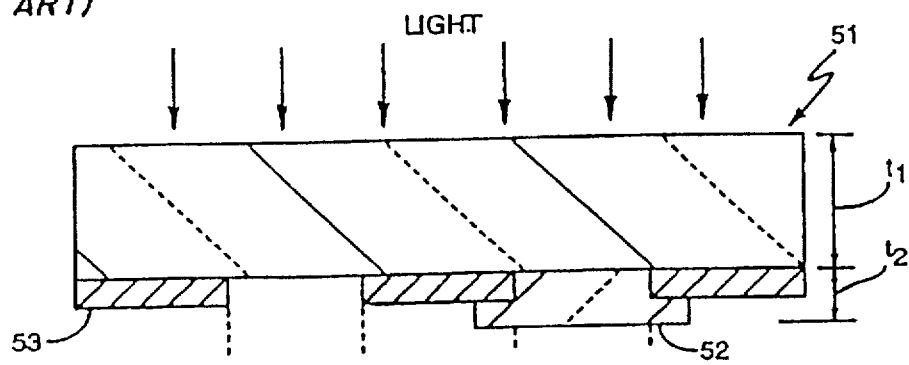
FIGS. 2(a) to 2(d) are schematic representations of diffraction effects and the use of prior art phase shift masking (PSM) to compensate for the effects of diffraction.
Figure 2B:
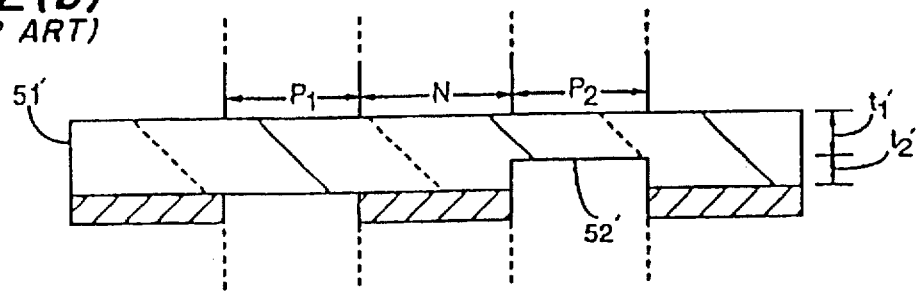
Figure 2C:
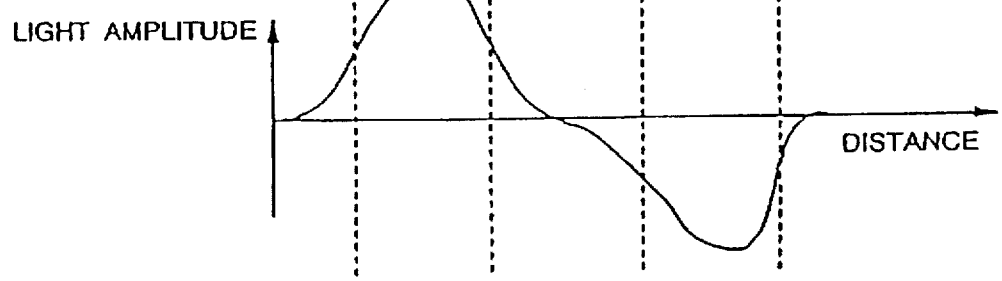
Figure 2D:
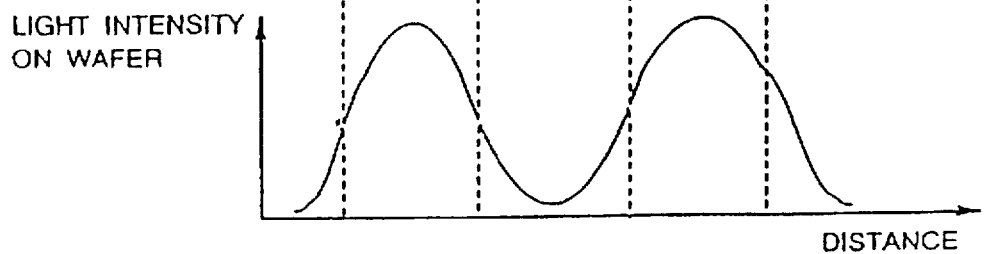
Figure 3A:
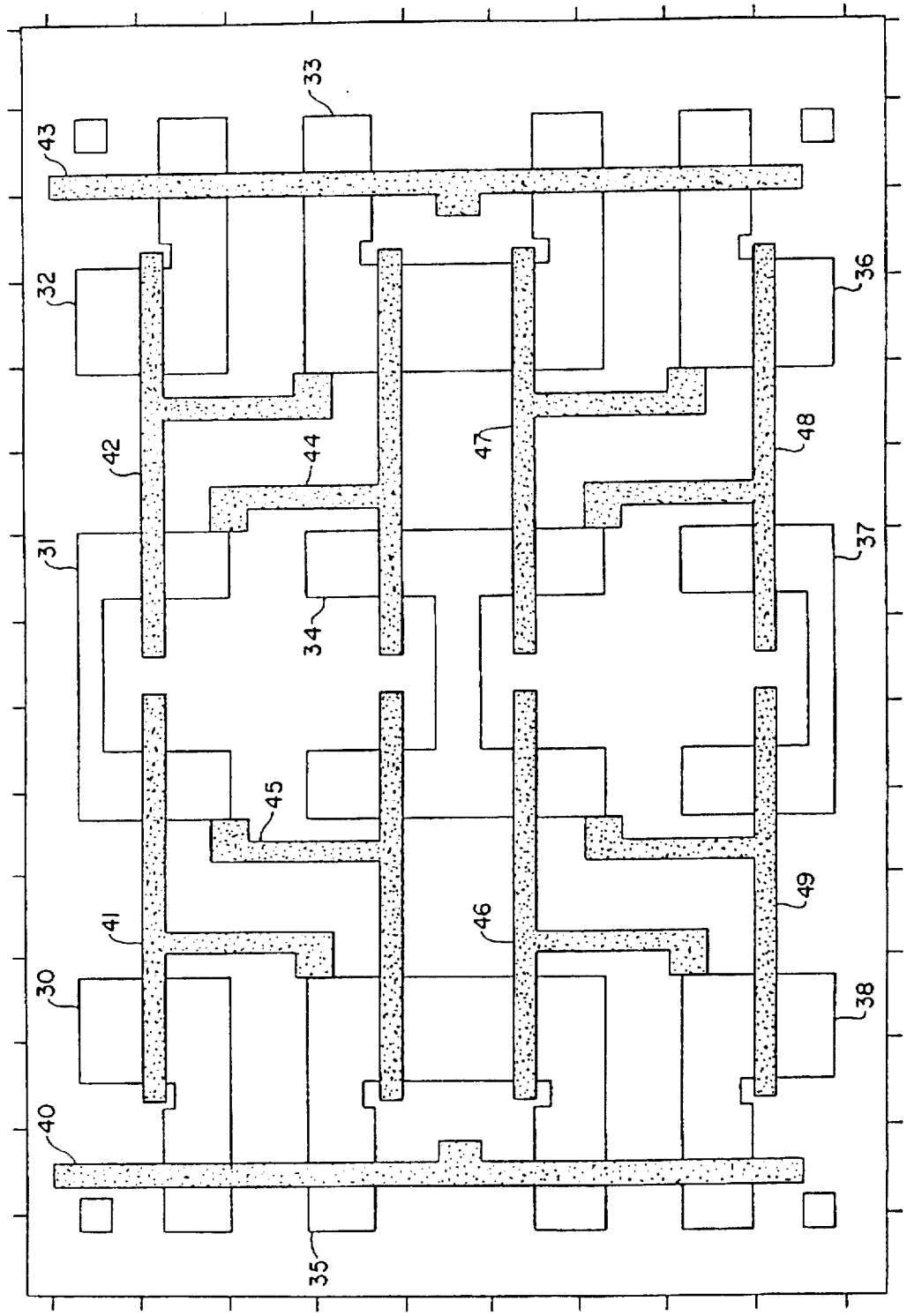
FIG. 3(a) is illustrative of a sample IC design showing the active areas (N and P) pattern and an overlay of the pattern of a gate level.

With reference to FIG. 3, there is shown, for purposes of illustration, a computer generated printout, in scale, of the aerial view of the layout of "doped" active regions, 30–38 of a circuit to be formed in the integrated circuit semiconductor wafer. Also shown in FIG. 3 overlaid on the active region layout, are computer generated solid black lines, representing the gate pattern, 40–49, called poly lines, which have been printed to the same scale as the active area and in this aerial view of FIG. 3 are positioned exactly as they would be positioned with respect to the active area on the target circuit. Assuming that the width dimensions of the poly lines of this design needs to be so narrow that optical diffraction effects would degrade the image of the mask if constructed by ordinary binary photolithography, then application of my invention method is needed to automatically make a alternating light field PSM and integrated circuits with such mask.

Figure 3B:
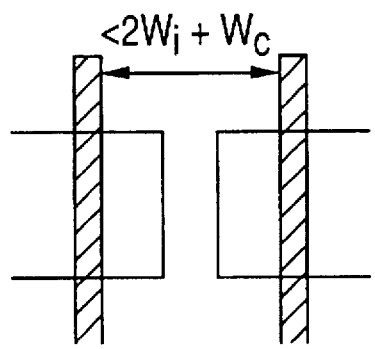
FIG. 3(b) illustrates two active regions having is gates which are so close together that the active regions must be constrained to have the same phase.
Figure 3C:
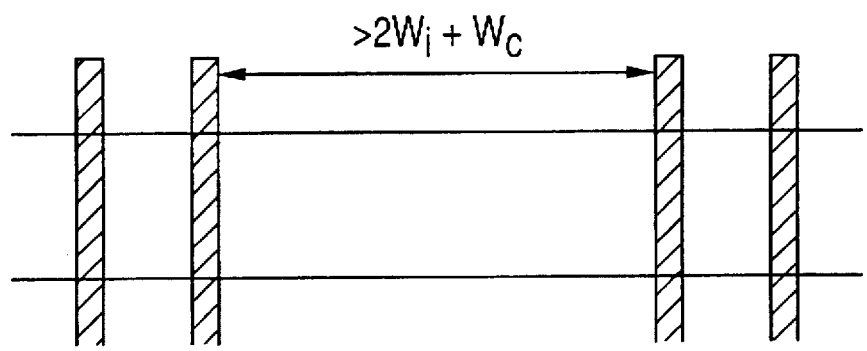
FIG. 3(c) illustrates two gates of the same active region separated by a large enough distance that the active region is permitted to have opposite phases.
Figure 4:
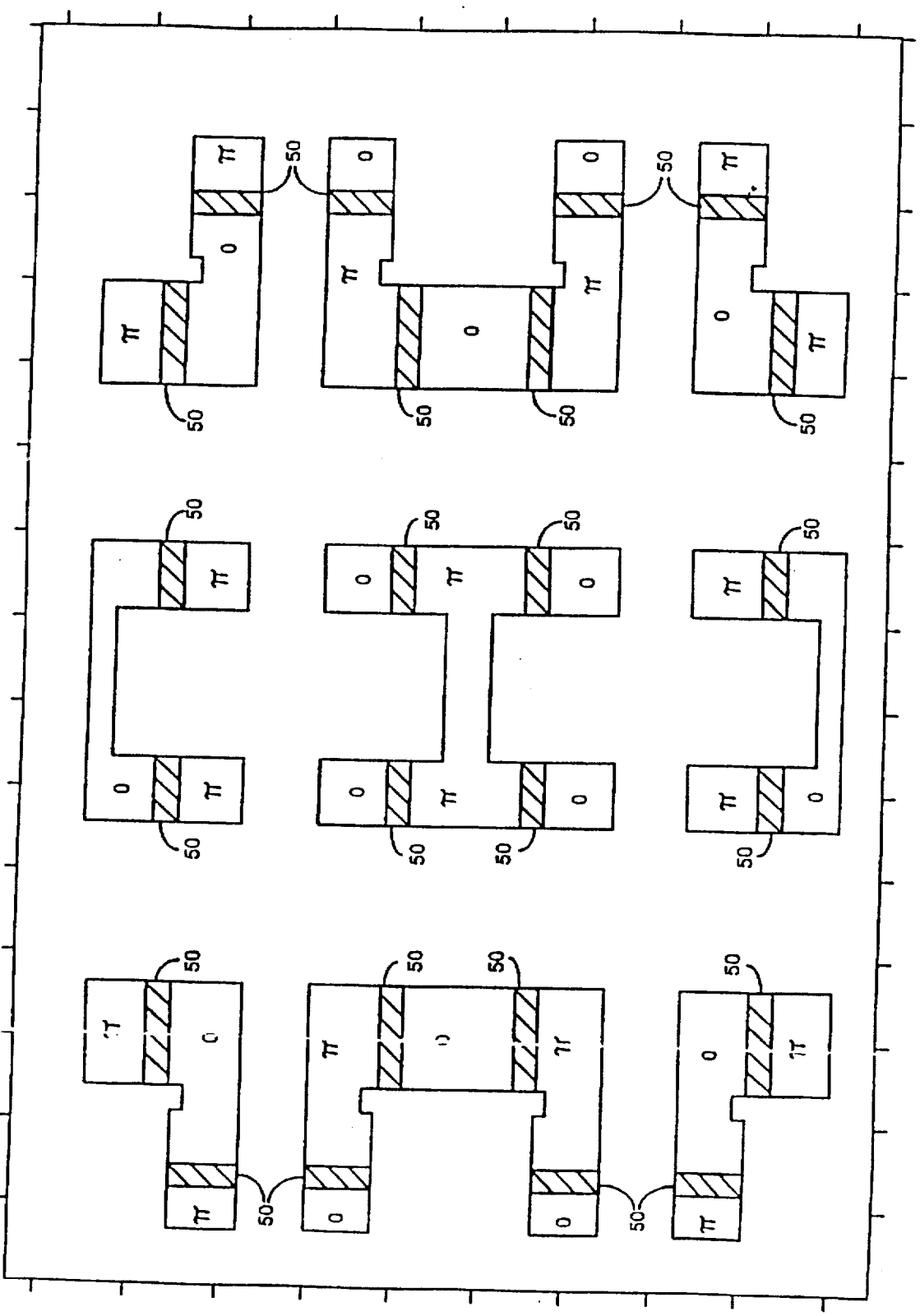
FIG. 4 is illustrative of the area of the Intersection of the active area and gate level including the designation of 0 degree and 180 degree phase shift regions according to this invention.

FIG. 4 contains hash marked areas 50 which represent the computer generated Intersection of the poly gate lines 40–49 of FIG. 3 and the semiconductor wafer active area regions 30–38 of FIG. 3. There are many ways to establish the Intersection plot. One approach is to have a computer perform the logical AND function, i.e. X·Y, pixel by pixel, where X is the active area spatial representation of FIG. 3 and Y is the gate level spatial pattern of FIG. 3. FIG. 4 also includes the outline region of the active area of FIG. 3. Next, the computer is employed to apply a scheme for automatically assigning zero degree and 180 degree regions on opposite sides of the Intersection. It is noted here that a person of ordinary skill in the art would recognize that other phase shift pairs may be assigned, e.g., 90° and 270°, as long as the phase shift pairs are separated by about 180°. Further, it should be understood that a phase shift difference of anywhere from about 170° to about 190° should result in the desired destructive intereference effects. Thus, in the following discussion, all references to 0° and 180° can be replaced, for example, with 0° and 170°, 0° and 190°, 40° and 220°, 60° and 250°, etc.

It is seen in FIG. 4 that the computer analyzes and then assigns a zero degree and a 180 degree region on opposite sides of each Intersection long dimension. There are constraints on the program for allocating phase selection for a given area: (1) every Intersection longer dimension must have a 0° and 180° border section; and (2) the 180 degree region and the zero degree region on each side of an Intersection along the longer dimension should have a width Wi and have an area around it which can be used as a compensation region. The compensation region should have width WC. If the area between two Intersections is less than $(2W_i+W_c)$, as illustrated in FIG. 3(b), then the area between the Intersections needs to be merged into a single phase 0° or 180° region.

On the other hand, as illustrated in FIG. 3(c), if the distance between two Intersection is greater than $(2W_i+W_c)$ and belongs to only a single continuous active region, this area can be broken up into two smaller continuous active regions with a separation between the two of at least $W_c$ and thereby permit the two smaller regions to be assigned phases which are different.

Similarly, if there exists an Intersection whose width is too large for alternating PSM to be of any tangible benefit, the active regions on either side of this "wide" Intersection can be assigned phases which are the same. The reason is that diffraction effects from the light transmitted through either side of this "wide" Intersection are too small to affect the contrast resolution.

Figure 5:
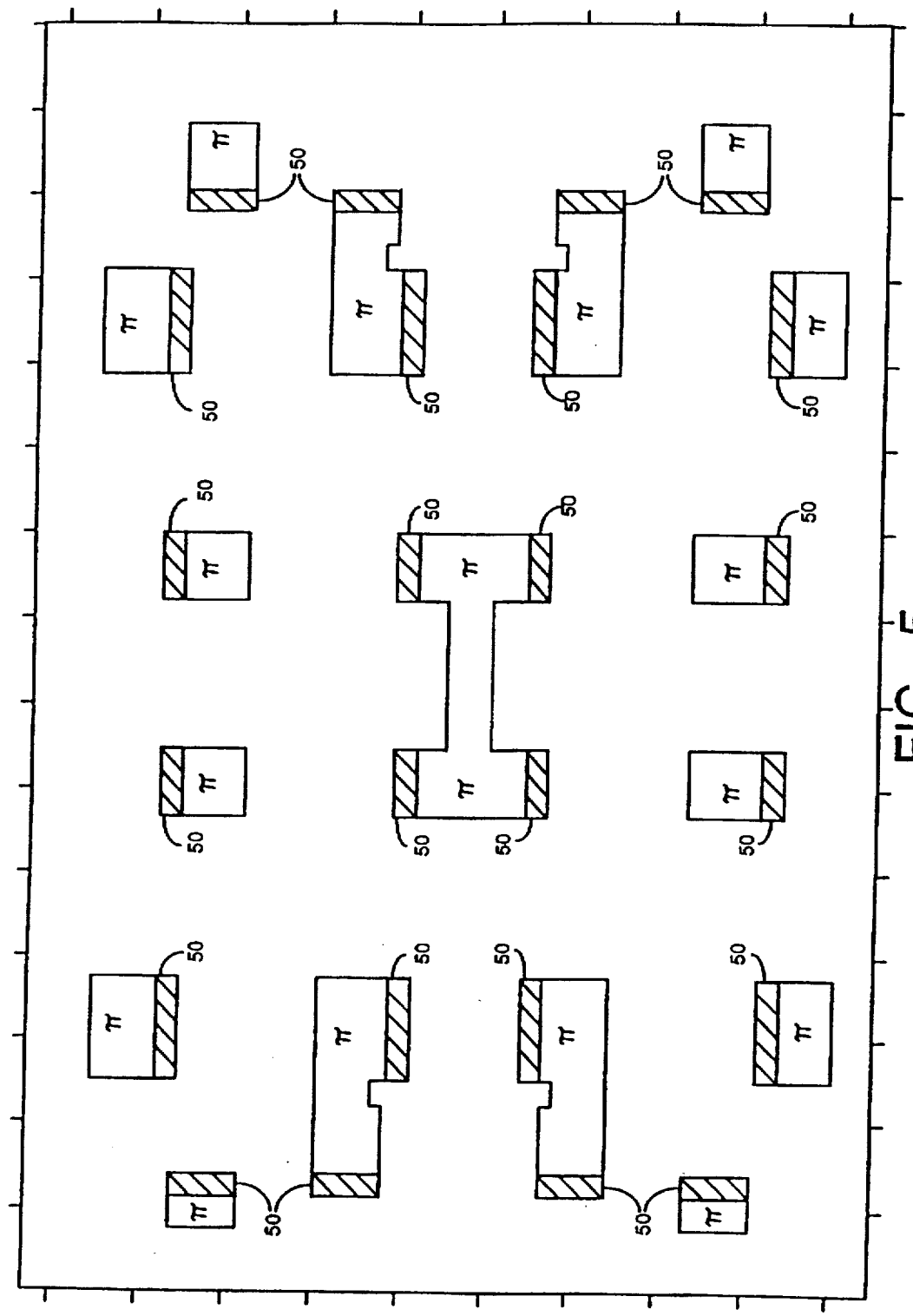
FIG. 5 is a redrawing of FIG. 4 illustrative of only the 180 degree phase shift regions of the sample design of FIG. 3.
Figure 6:
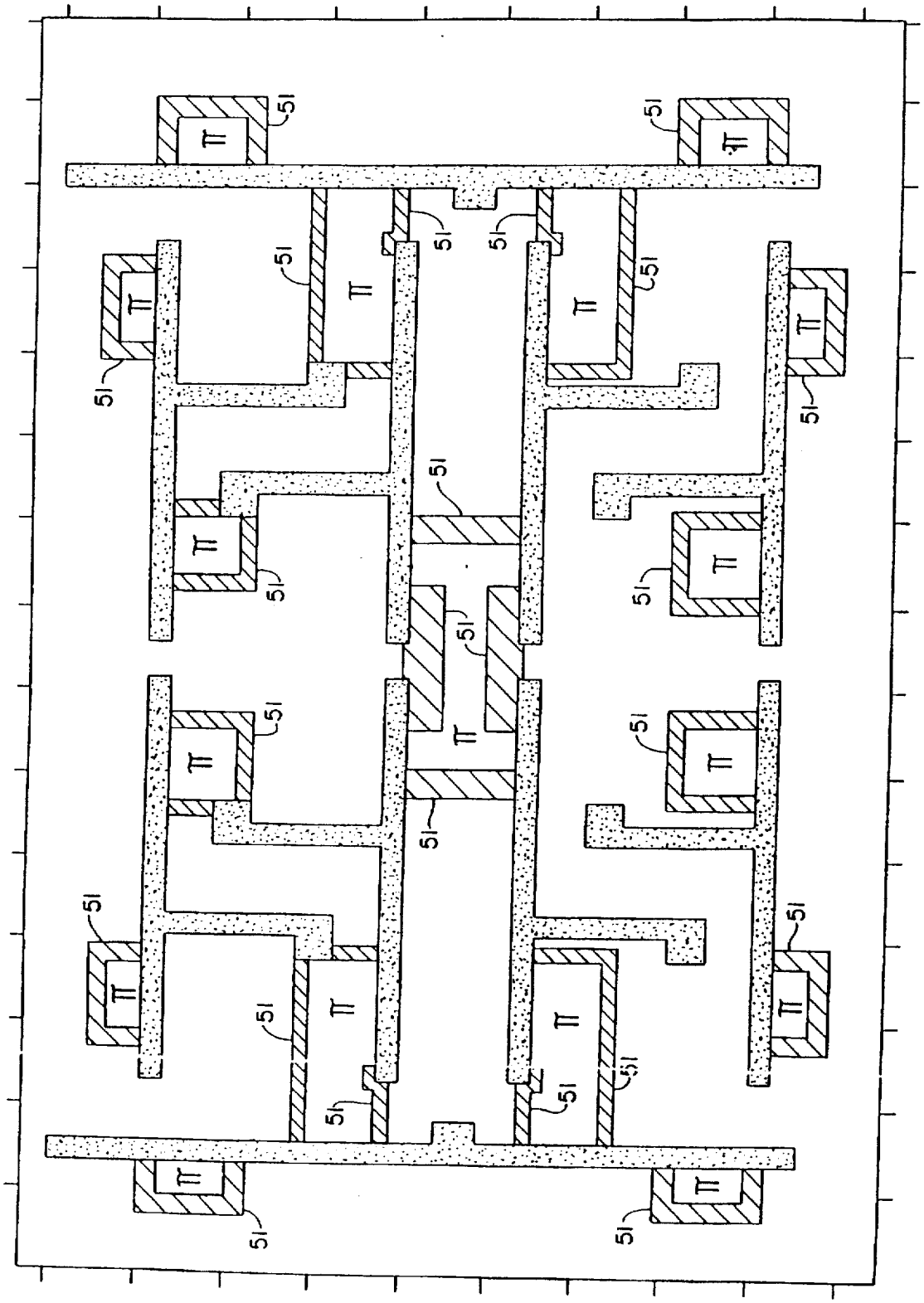
FIG. 6 is a version of a resulting PSM of the invention for the example of FIG. 3 showing gate contact opaque chrome lines and the transition compensation regions surrounding the 180 degree regions.

FIG. 4 is redrawn in FIG. 5 except that the outline of zero degree areas has been deleted so that the FIG. 5 labels only the π regions. The remaining region is assumed to be zero phase. However, as noted earlier, it is recalled that one of the problems with light field designs is that, unless compensated, a dark line is formed on the wafer which corresponds to the line where the 180° region abuts a 0° region. Accordingly, in FIG. 6, a region called the transition region 51 is shown formed between every 180° region and its adjoining zero degree region. The only portion of the periphery of the 180 degree region which are not interfaced by a transition region 51 is where the 180° region abuts the intersection regions 50. FIG. 6 also includes opaque line regions 40–49 which are overlaid on the compensated 180 degree regions, so that FIG. 6 is the aerial representation of one embodiment of the final computer generated light field alternating PSM for a single exposure to produce the gate level poly pattern depicted in FIG. 3. In a single exposure step, assuming a positive resist is employed on a wafer, if a PSM is manufactured according to FIG. 6 design, the gate layered circuit of FIG. 3 aerial view will be able to be produced.

Figure 7:
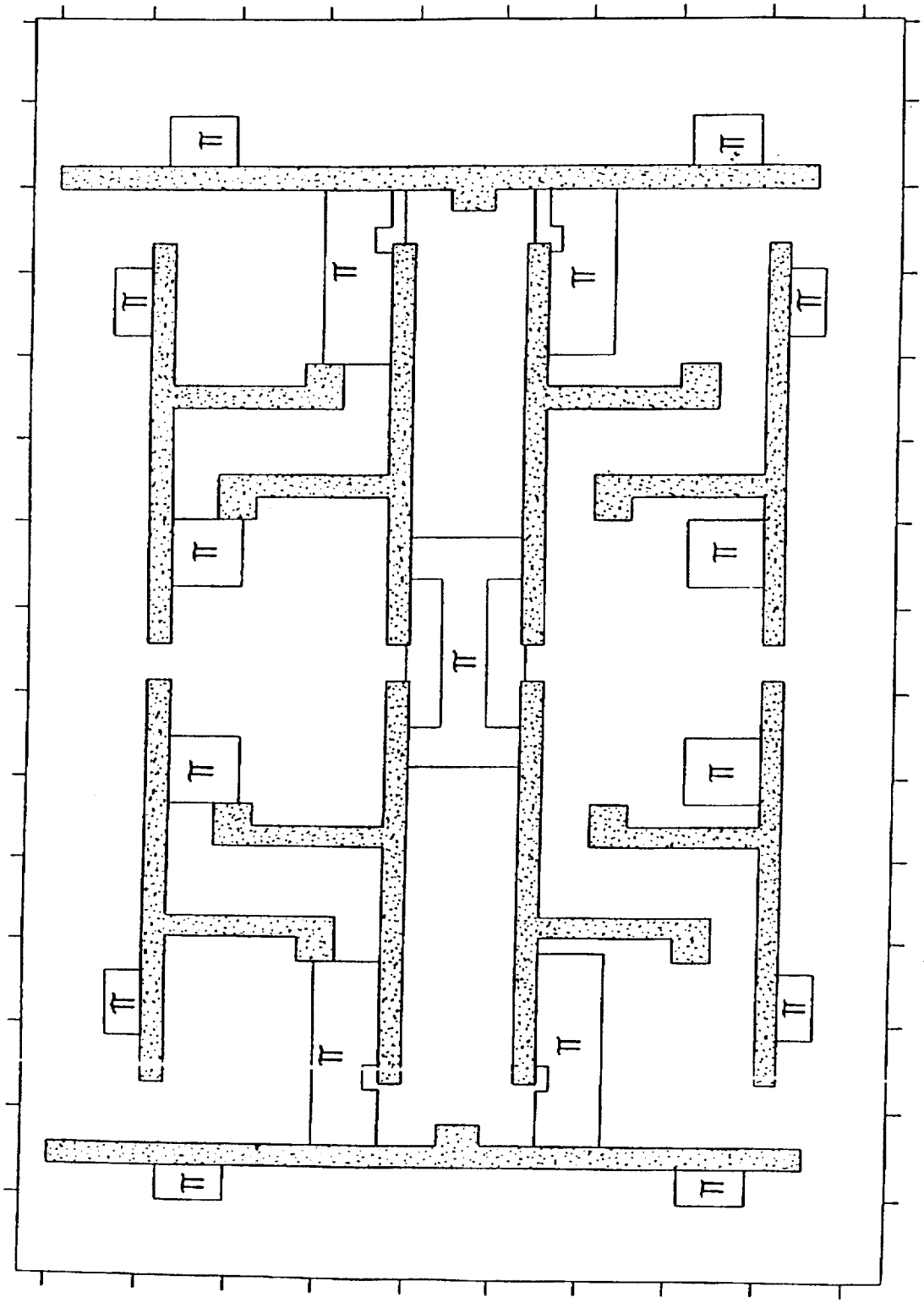
FIG. 7 is a version of alternative PSM for the example of FIG. 3 showing gate contact opaque chrome lines and the 180 degree regions without surrounding transition compensation regions.
Figure 8:
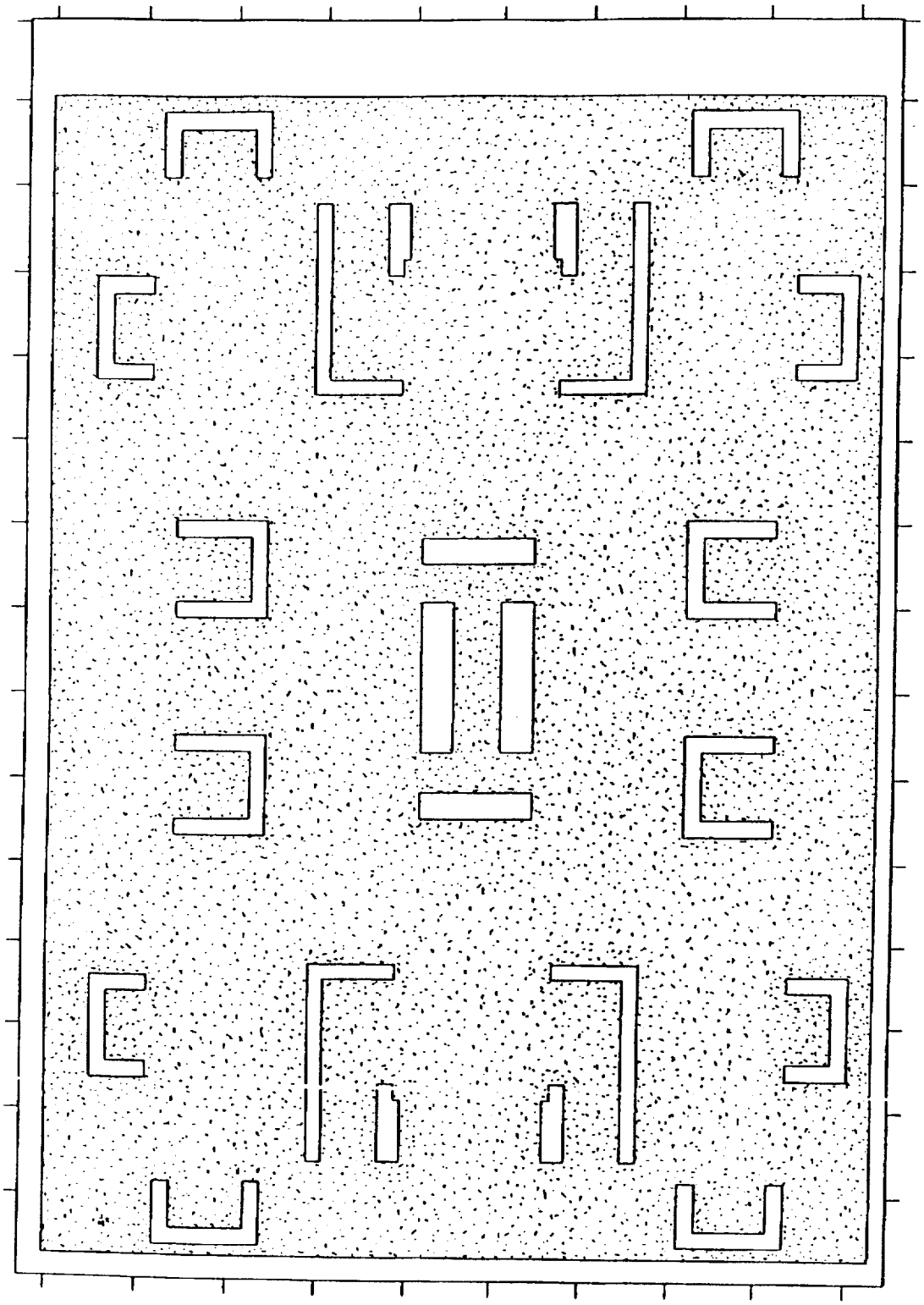
FIG. 8 is a version of trim mask for use following exposure by the mask of FIG. 7 to avoid lines caused by 0°/180° transition.

Alternatively, a two step exposure method can also accomplish the gate level poly patterns depicted in FIG. 3. FIG. 7 is identical to FIG. 6 but without any compensating transition region surrounding each 180 degree region. As noted, when exposing in a first step the positive photoresist on the wafer with a light field PSM of the form of FIG. 7, dark lines will be imaged along the line where 180° regions abut 0° regions. These unwanted dark lines can then be removed by a second exposure of the wafer through the "trim" mask of FIG. 8, provided no development is carried until completion of both exposure steps. The trim mask is transmissive along every 0/180 degree region abutting line so that the second exposure of the positive photoresist results in exposure and hence removal of the dark lines during resist development.

Figure 9A:
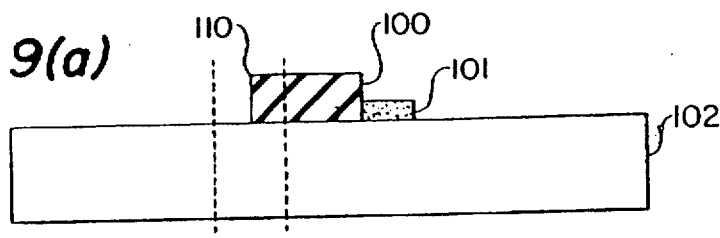
FIGS. 9(a) to 9(c) are cross sections illustrative of the alignment of a trim mask transparent aperture center line with the abutting line of the 0°/180° regions of the non-transition compensated mask of FIG. 8.
Figure 9B:
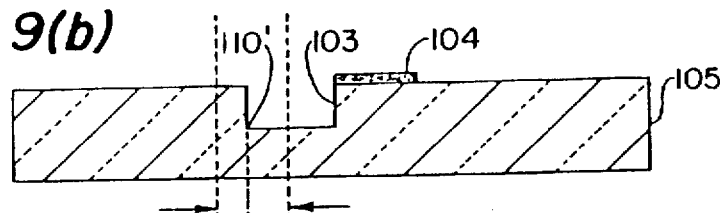
Figure 9C:
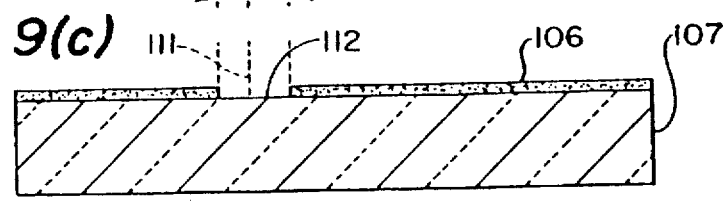

FIGS. 9(a) to 9(c) illustrate one embodiment of the alignment and construction of a trim mask. FIG. 9(a) is a cross section of a deposited 180 degree phase shift region 100 which has an abutting transition line 110 between the 180 degree region and the zero degree region, 102. In FIG. 9(b) an etched shifter 105 is illustrated and the transition 110' between the zero and 180 degree region is also shown. A trim mask 107 for the shifter masks of FIG. 9(a) and 9(b) is shown in FIG. 9(c). The trim mask 107 is aligned so that the center 111 of the transmission region 112 is aligned with the transition 110 or 110'. The UV light which transmits through the trim mask falls on the positive photoresist and exposes that region so that it will be removed during development of the resist. (It is noted that it is understood by those skilled in the art that following resist development, the non-exposed photoresist remains in place over the top of the region to be retained. Since the photoresist is over the top of a polysilicon or metal layer, after the resist is removed and the wafer is etched, the remaining resist protects the lines beneath it so that the uncovered poly (metal) on the wafer surface is removed, leaving the desired gate contact pattern.)

With reference to FIG. 11(a) and FIGS. 12(a) to 12(d), a compensation transition region configuration embodiment is depicted. The transition region can be constructed of step regions, preferably two or more step regions, such as 120 degrees (71) and 60 degree (70) interposed between the π region and the zero degree region. A single π/2 step region may also work in some instances. Physically, these stepped phase transition regions should have a minimum width of 0.2 λ/NA, where λ is exposure wavelengths and NA is numerical aperture of the stepper and can be configured according to FIG. 12(a) for a deposited shifter or 12(b) for an etched shifter. Alternatively, the transition region can also have more steps or be a graded transition according to 12(c) or 12(d) for deposited or etched PSM respectively.

Figure 11A:
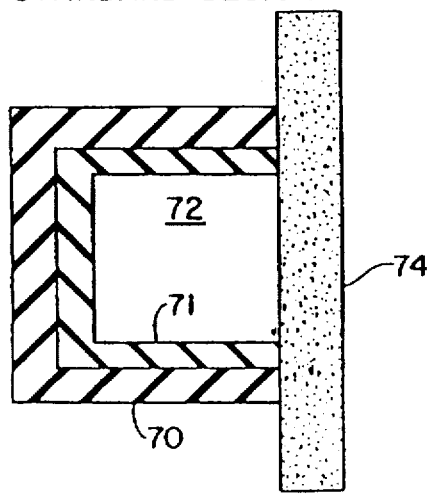
FIGS. 11(a) and 11(b) illustrates the standard gate metal design and the reduced gate design respectively.

When narrow gates are desired, opaque layers, e.g., layer 74 in FIG. 11(a), may not be necessary, because one way to create the narrowest possible gate would be to employ the dark natural line formed at the Intersection which coincides with the abutting of the 180/0 degree regions. For example, using a stepper with a numerical aperture of 0.5, a partial coherence factor 0.5 for the light source, and an exposure wavelength of 365 nm, and an alternating PSM, this minimum gate was 0.2 microns.

Figure 11B:
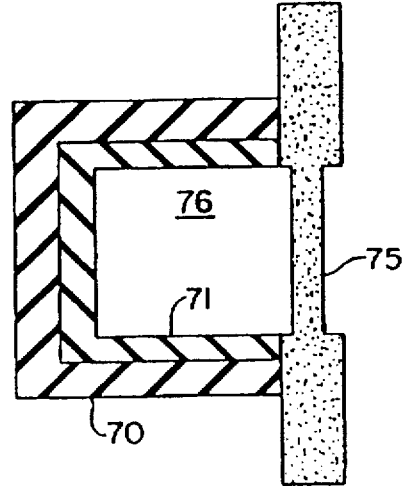

As shown in FIG. 11(b), as another alternative, I provide a very narrow opaque line, 75 on the mask as shown which would overlay the 0/180 degree natural dark abutting transition. This narrow opaque line is very slightly narrower than the natural width of 0.2 microns, such as 0.18 microns or whatever increment is required to provide reliability in manufacturing yield.

Figure 11C:
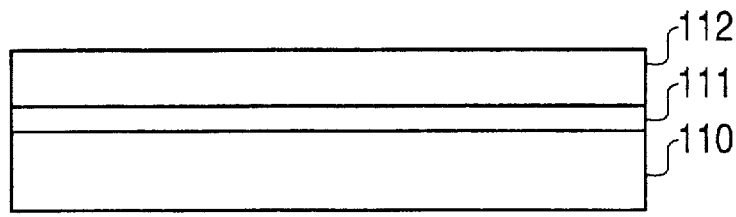
FIGS. 11(c) to 11(h) are cross sections illustrative of how the optical lithography mask according to the invention is produced.

FIGS. 11(c) to 11(h) illustrate one process of forming an optical lithography mask according to the invention. In FIG. 11(c), an opaque chrome layer 111 and a first photoresist layer 112 is deposited on a quartz substrate 110. Portions of the first photoresist layer 112 are exposed (FIG. 11(d)) and the chrome layer 111 partly etched away to form an opaque chrome layer 111' having a gate level pattern (FIG. 11(e)). Thereafter, in FIG. 11(f), a second photoresist layer 113 is deposited onto the quartz substrate 110 and the chrome layer 111'. Portions of the second photoresist layer 113 are exposed (FIG. 11(g)) and the quartz substrate 110 etched away to form a phase shift region 114 and a mask 115. In the exposure step associated with FIG. 11(g), the exposure opening may be as narrow as the opening between the chrome layers ($W_0$) or as wide as the opening between the chrome layers plus the respective widths of the chrome layers ($W_0+W_1+W_2$). Such a permissible range of exposure opening widths improves the manufacturing efficiency.

Figure 11D:
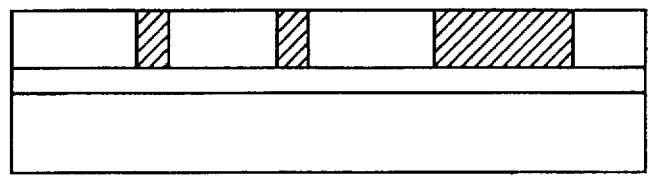
Figure 11E:
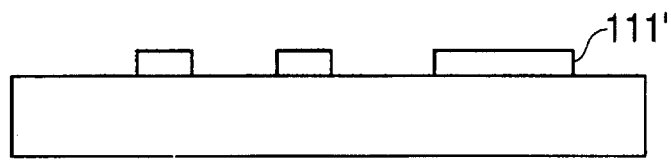
Figure 11F:
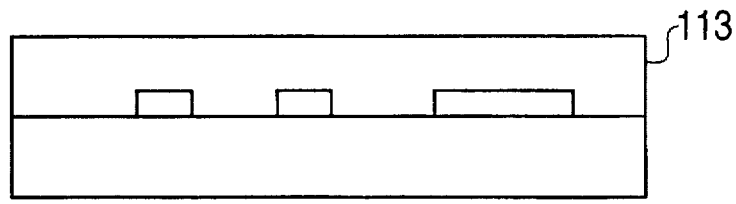

If a narrow opaque line 75 is desired, during the exposure step of FIG. 11(d), reduced width portions of the Intersections, rather than the normal width portions of the Intersections, are exposed. Thereafter, when the opaque chrome layer is etched in FIG. 11(e), the narrow opaque line 75 of FIG. 11(b) results. The narrow opaque line 75 is desirable for at least the following reasons.

(1) The narrow opaque line 75 conceals the phase edge during subsequent optical lithography on a wafer and reduces the displacement of the wafer image caused by misalignment of the phase shift layer to the opaque layer on the mask.

(2) The narrow opaque line 75 reduces line width error at the abutting 180°/0° transition caused by misalignments of phase layers where a multiple phase step method is used.

Figure 11G:
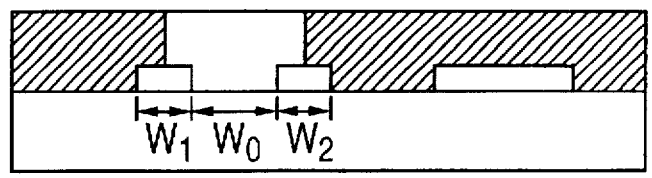
Figure 11H:
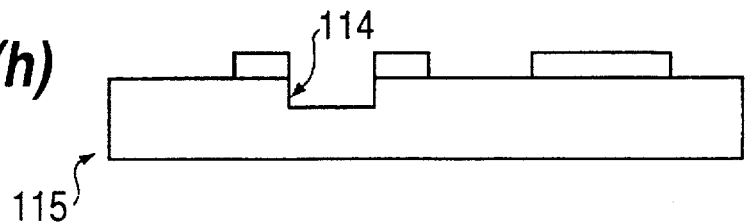
Figure 12A:
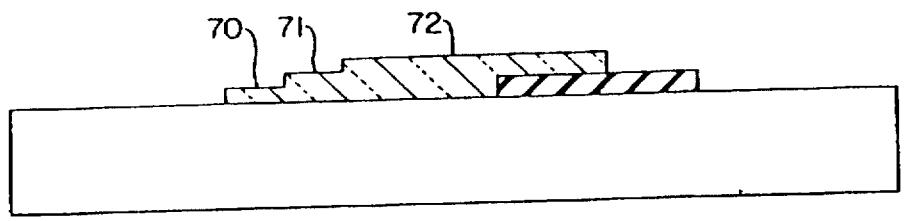
FIGS. 12(a) to 12(d) are illustrative of several configurations of transition compensation region shifter embodiments.
Figure 12B:
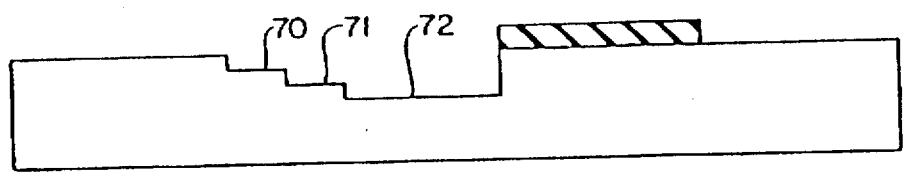
Figure 12C:
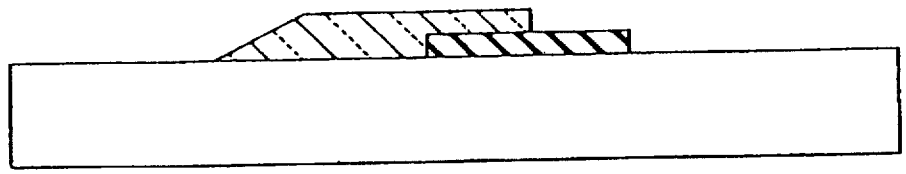
Figure 12D:
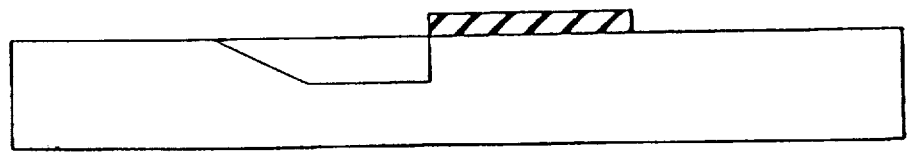

(3) The narrow opaque line 75, typically chromium, provides a more robust mask to etching (during the step associated with FIG. 11(g)) than the photoresist, providing a steeper etched profile.

The natural line width for a stepper is defined as 0.25*λ/NA; where λ is the excitation wavelength and NA is numerical aperture.

Figure 10:
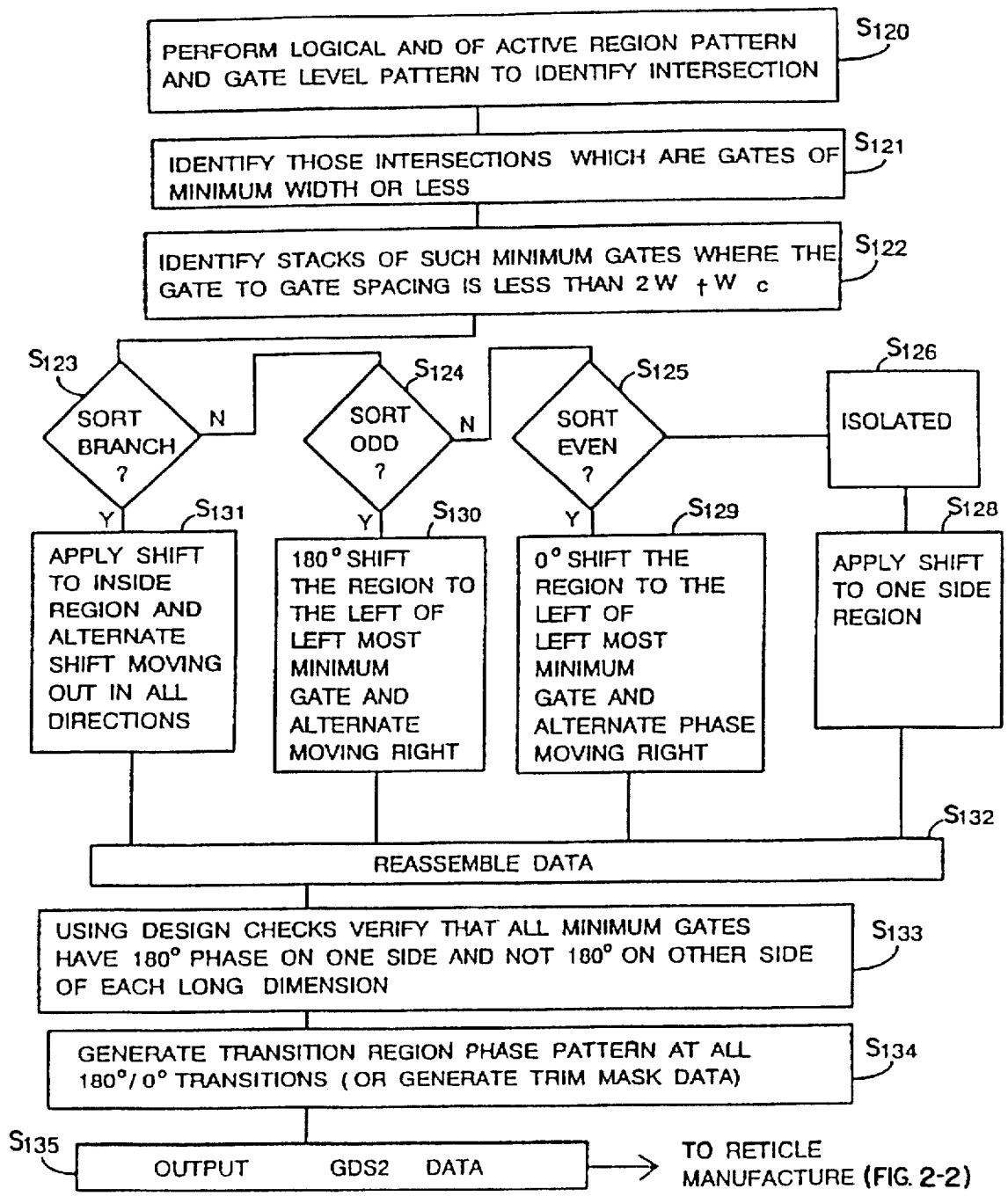
FIG. 10 is a flow diagram for the procedure to manufacture an alternating PSM with compensating transition regions and reduced gate lengths and to perform photolithography using said alternating light field PSM and positive photoresist.

The procedure described above is more fully illustrated in the flow diagram of FIG. 10. Specifically, block S120 depicts the AND operation to determine the Intersection of the active area pattern and poly gate contact pattern. Next, in block S121, all gates which are narrower than the minimum width achievable without phase shift masking are identified. Block S122, depicts a subclassification step which identifies groupings of minimum width gates which are contiguous and where the gate to gate spacing is too close for transition regions, i.e. less than $2W_t+W_c$. These groupings are called "stacks". Gates which are not in a stack are classified as isolated gates (block S126). Next, the "stacks" identified in block S122 are further subclassified into branch (block S123), odd (block S124), or even (block S125) stacks.

The odd stacks are groups in which an odd number of minimum gate intersections occur on a common active area bordered by a spacing on both sides which is large enough for a transition region. In block S130, these odd stack regions are to be phase shifted by applying 180° phase shift to the left most region and then progressively alternating the phase from 180° to 0° and 0° to 180° for regions between gates progressively from left to right.

In block S125, the even stack regions are groups where an even number of intersections occur on a common active area bordered by a spacing large enough for a transition region. The strategy here is to apply 0° phase shift to the left most region and progressively alternating the phase from 0° to 180° to 0° for regions between gates progressively from left to right.

For isolated regions (block S126), one side of the gate is to provided with a transition compensation region, i.e. graduated or steps of phases to eliminate the formation of an unwanted line.

Branch regions are regions in which parts of a single active region is bordered by more than two minimum gates. This contrasts to the odd and even stack. The shift strategy for such branch stack regions is to select one phase, either 180° or 0°, for the central region having more than two Intersections, and then working outward in all directions, alternating phase as one crosses each gate.

In block S132, the data for each type of stack and for isolated gates is reassembled and then verified by the Design Rule Checker (block S133) to confirm and verify that all minimum gates have 180° or 0° phase one side and not on the other side of each long dimension.

In block S134, the transition regions are generated for every location where 180°/0° regions abut such as at the short side of a gate and at the edge of a stack. Alternatively, as depicted earlier, the transitions could be replaced by a separate trim mask for which the data is now generated.

Finally, output data is created for the mask generation (block S135). A software module creates the output data, typically in GDS2 or MEBES file format for an e-beam mask writer. For phase shifting type masks, data for more than one layer are output to create the poly reticle and the software module will create the tape output containing all the layers required to create the phase shift mask and the trim mask if this alternative is elected.

The positive photoresist used in this invention are available commercially under numerous tradenames. The invention is not limited to these currently used resists.

9

The reticles typically are made from amorphous silicon dioxide, i.e. synthetic quartz, and the opaque material is typically chrome. Any opaque material could theoretically be used in place of chrome for this invention and the invention is not dependent on the specific material employed.

Alternatively, the PSM lithography method described above for light field designs can be implemented in dark field designs. In the dark field implementation, the dark areas on the photoresist layer develop away while the clear areas remain. The object is to develop clear areas which resemble the gate level pattern 130 on the photoresist layer as illustrated in FIG. 13(a).

Figure 13A:
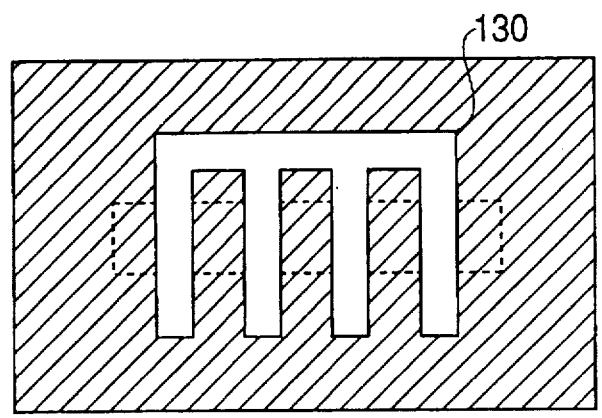
FIG. 13(a) illustrate a clear gate level pattern produced on a negative photoresist.
Figure 13B:
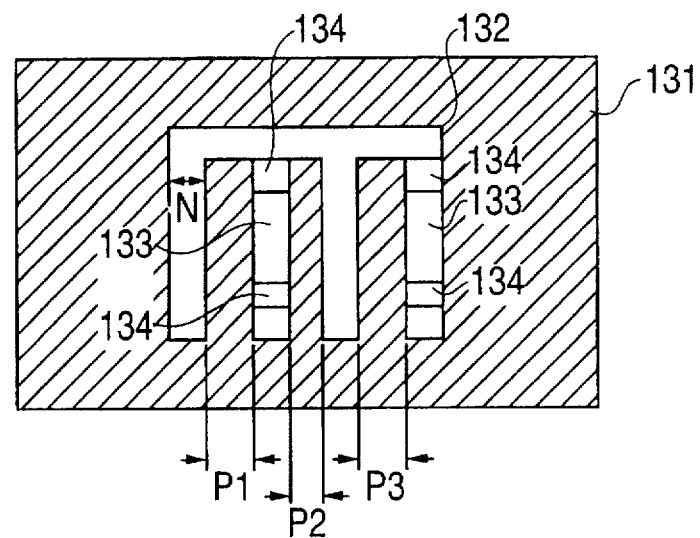
FIG. 13(b) illustrate an optical lithography mask used in forming the clear gate level pattern of FIG. 13(a).

FIG. 13(b) illustrates the reticle 131 which is used to develop the clear gate level pattern 130 of FIG. 13(a). The reticle 131 has a 0° phase shift region 132, a 180° phase shift region 133 and a transition region 134 between the 0°/180° phase shift regions. As in the light field implementation the transition region 134 can be constructed of step regions, preferably two or more step regions, such as 60° region and a 120° region interposed between the 0°/180° phase shift regions, or accounted for by a trim mask.

Phase shift masking may not be necessary in dark field implementations however. For example, in FIG. 13(b), if the distances P1, P2, P3 are large enough, the interference effects will be minimal, and it would not be necessary to use phase shift masking. On the other hand, as P1, P2, P3 decreases, the interference effects will increase and destructive interference effects from phase shift masking would be necessary. In memory circuits, for example, the distances P1, P2, P3 are approximately equal to the gate width N and therefore a dark field implementation using phase shift masking should be beneficial.

Figure 13C:
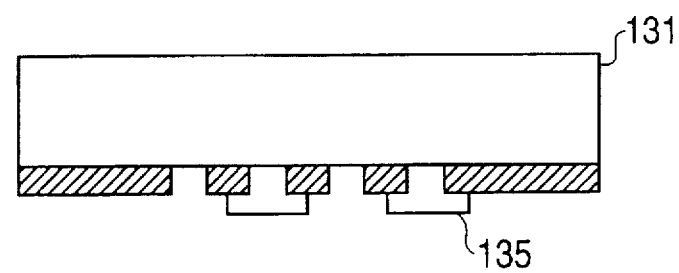
FIGS. 13(c) and 13(d) are two cross sections illustrative of how phase shift regions can be incorporated into the clear gate level pattern of FIG. 13(a).
Figure 13D:
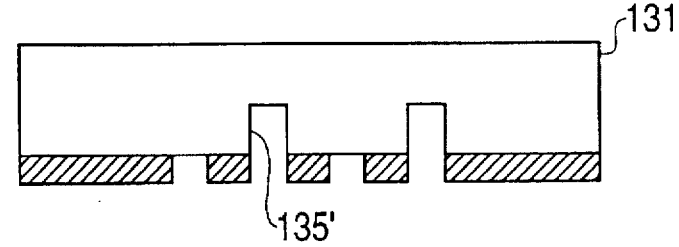

FIGS. 13(c) and 13(d) are two cross sections illustrative of how phase shift areas can be incorporated into the clear gate level pattern 130. In FIG. 13(c), an additional layer of light-transmissive material 135 is provided to form 180° phase shift regions and, in FIG. 13(d), a layer of light-transmissive material 135' is etched away to form 180° phase shift regions.

Figure 14:
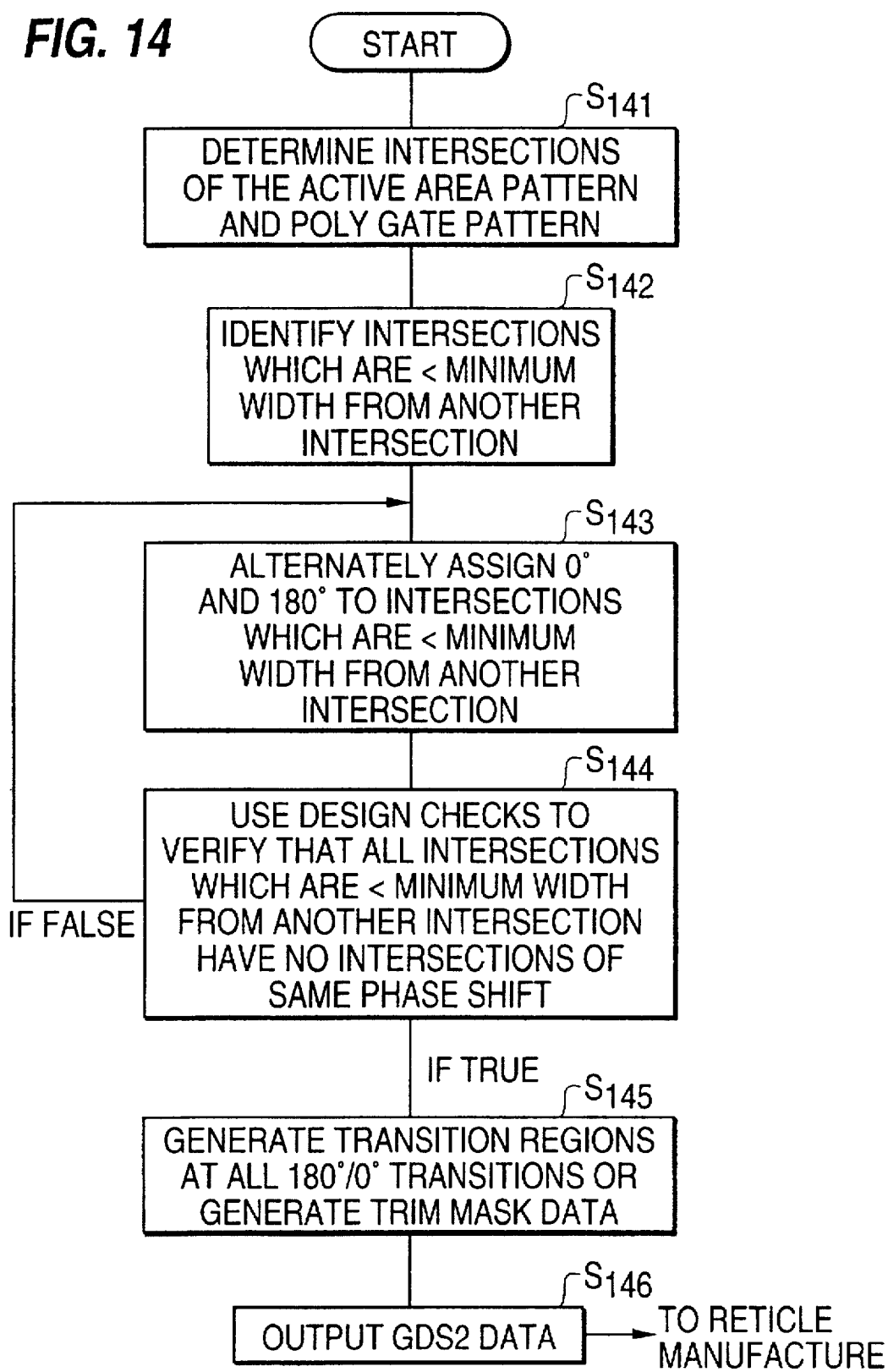
FIG. 14 is a flow diagram for the optical photolithography method using said alternating dark field PSM and negative photoresist.

FIG. 14 is a flow diagram for the procedure to patterning phase shift masks used in dark field implementation. Block S141 depicts the AND operation to determine the Intersection of the active area pattern and the poly gate pattern. Next, in block S142, all the Intersections which are separated from an adjacent Intersection by less than the minimum width are identified. In block S143, the poly gate patterns which are separated by less than the minimum width are assigned phases of 0° and 180° alternately. Block S144 uses the Design Rule Checker to confirm and verify that no Intersection which is less than a minimum width away from an adjacent Intersection has the same phase shift as the adjacent Intersection. If Block S144 is False, the flow is returned to Block S143 to reassign the phase shift regions. If Block S144 is True, the transition regions are generated for every location where 180°/0° regions abut (Block S145). Alternatively, the transitions could be replaced by a separate trim mask for which the data is now generated.

Finally, in Block S146, output data is created for the mask generation. A software module creates the output data, typically in GDS2 or MEBES file format for an e-beam mask writer. For phase shifting type masks, data for more than one layer are output to create the poly reticle and the software module will create the tape output containing all the layers required to create the phase shift mask and the trim mask if this alternative is elected.

The figures of this document depict embodiments of this invention and are not intended to limit the scope of the invention. The scope of claims shall be construed in accordance with the claims.

What is claimed is:

1. A method of forming a mask for a gate level of an integrated circuit, said method comprising the steps of:

forming a gate level pattern on a mask substrate;

identifying regions of the mask substrate which correspond to active regions of the integrated circuit and identifying one or more portions of the gate level pattern which overlap with the active regions of the integrated circuit; and forming phase shift regions having a phase difference of about 170°–190° on opposite sides of at least one identified portion.

2. A method as recited in claim 1, wherein the step of forming includes etching a portion of the mask substrate to alter the phase of the light transmitted therethrough by about 170°–190°.

3. A method as recited in claim 1, wherein the step of forming includes depositing an additional layer of the mask substrate to alter the phase of the light transmitted therethrough by about 170°–190°.

4. A method as recited in claim 1, further comprising the steps of:

identifying regions on the mask, other than said one or more identified portions, which cause light transmitted through opposite sides thereof to destructively interfere with each other; and forming a transition phase shift region adjacent to each of the identified regions, the transition phase shift region having one or more additional phase shift regions.

5. A method as recited in claim 1, further comprising the steps of:

comparing widths of the identified portions with a predefined minimum width; and maintaining an equal-valued phase shift on both sides of the identified portions whose widths are larger than the predefined minimum width.

6. A method as recited in claim 5, wherein the step of forming includes the steps of:

for each identified region corresponding to the active regions of the integrated circuit and intersected by the gate level pattern, determining a contiguous piece of the identified region; and if the contiguous piece of the identified region has a length greater than $2W_i+W_c$ and is bounded on either side by the gate level pattern, dividing the contiguous piece into two separate phase shift regions with a separation distance of at least $W_c$.

7. A method as recited in claim 6, wherein the step of forming further includes the steps of:

determining distances between each pair of identified portions; and if any of the distances is less than $2W_i+W_c$, maintaining one continuous phase shift region between any such pair of identified portions.

8. A method as recited in claim 7, further comprising the step of verifying that a phase shift difference of the phase shift regions on either side of each identified portion whose width is less than or equal to the predefined minimum width is between about 170°–190°.

9. A method of forming a mask for a gate level of an integrated circuit, said method comprising the steps of:

identifying regions of a mask substrate which correspond to active regions of the integrated circuit and identifying one or more portions of a gate level pattern which overlap with the active regions of the integrated circuit;

forming the gate level pattern on the mask substrate, the gate level pattern having a reduced width on at least one identified portion; and forming phase shift regions having a phase difference of about 170°–190° on opposite sides of said at least one identified portion.

10. A method as recited in claim 9, wherein the step of forming includes etching a portion of the mask substrate on one side of said at least one identified portion so as to alter the phase of the light transmitted through the etched portion by about 170°–190°.

11. A method as recited in claim 10, further comprising the step of verifying that a phase shift difference of the phase shift regions on either side of each identified portion whose width is less than or equal to the predefined minimum width is between about 170°–190°.

12. A method of forming a mask for a gate level of an integrated circuit, said method comprising the steps of:

forming a light-transmissive gate level pattern on an opaque mask substrate;

identifying regions of the opaque mask substrate which correspond to active regions of the integrated circuit and identifying one or more portions of the gate level pattern which overlap with the active regions of the integrated circuit; and forming a phase shift region having a phase of about 170°–190° on at least one identified portion.

13. A method as recited in claim 12, wherein the step of forming includes the steps of:

determining a distance between two adjacent identified portions; and if the distance is less than or equal to a predefined minimum distance, forming the phase shift region on one of the two adjacent identified portions.

14. A method as recited in claim 13, wherein the step of forming further includes the step of forming a transition phase shift region adjacent to at least one end of said one of the two adjacent identified portions.

15. A method as recited in claim 12, wherein the step of forming includes the steps of:

determining a distance between two adjacent identified portions; and if the distance is less than or equal to the width of one of the two adjacent identified portions, forming the phase shift region on one of the two adjacent identified portions.

16. A mask for producing a gate level pattern on a substrate of an integrated circuit, comprising:

a light-transmissive mask substrate;

an opaque gate level pattern formed on the mask substrate; and phase shift regions of opposite phases formed on opposite sides of those portions of the opaque gate level pattern which overlap with active regions of the integrated circuit, but not necessarily on opposite sides of those portions of the opaque gate level pattern which do not overlap with active regions of the integrated circuit, wherein the width of the opaque gate level pattern at the overlapping portions are smaller than the width of the opaque gate level pattern at the non-overlapping portions.

17. A mask as recited in claim 16, wherein some phase shift regions include etched portions which alter the phase of the light transmitted therethrough by about 170°–190°.

18. A mask as recited in claim 16, wherein some phase shift regions include thicker portions which alter the phase of the light transmitted therethrough by about 170°–190°.

19. A mask as recited in claim 16, further comprising transition phase shift regions formed adjacent to regions, other than the overlapping portions, which cause light transmitted through opposite sides thereof to destructively interfere with each other, the transition phase shift region including one or more additional phase shift regions.

20. A mask as recited in claim 19, wherein the phases of the one or more phase shift regions increase linearly.

21. A mask as recited in claim 19, wherein the phases of the one or more phase shift regions increase stepwise.

22. A mask for producing a gate level pattern on a substrate of an integrated circuit, comprising:

an opaque mask substrate;

a light-transmissive gate level pattern formed on the opaque mask substrate;

phase shift regions of opposite phases formed at those portions of the opaque gate level pattern which overlap with active regions of the integrated circuit; and transition phase shift regions formed on at least one end of the phase shift regions.

23. A mask as recited in claim 22, wherein some phase shift regions include etched portions which alter the phase of the light transmitted therethrough by about 170°–190°.

24. A mask as recited in claim 22, wherein some phase shift regions include thicker portions which alter the phase of the light transmitted therethrough by about 170°–190°.

25. A mask as recited in claim 22, wherein each transition phase shift region includes one or more additional phase shift regions.

26. A mask as recited in claim 22, wherein the phases of the one or more phase shift regions increase linearly.

27. A mask as recited in claim 26, wherein the phases of the one or more phase shift regions increase stepwise.

* * * * *